United States Patent
Uyama et al.

(10) Patent No.: US 10,906,304 B2
(45) Date of Patent: Feb. 2, 2021

(54) SEMICONDUCTOR ELEMENT, RECORDING ELEMENT SUBSTRATE, AND LIQUID DISCHARGE HEAD

(71) Applicant: CANON KABUSHIKI KAISHA, Tokyo (JP)

(72) Inventors: Masaya Uyama, Kawasaki (JP); Takuya Hatsui, Tokyo (JP); Souta Takeuchi, Fujisawa (JP); Masataka Kato, Hiratsuka (JP); Toru Nakakubo, Kawasaki (JP); Tomohiro Takahashi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/452,336

(22) Filed: Jun. 25, 2019

(65) Prior Publication Data
US 2020/0001605 A1    Jan. 2, 2020

(30) Foreign Application Priority Data

Jun. 29, 2018 (JP) ................................. 2018-125042
May 22, 2019 (JP) ................................. 2019-096199

(51) Int. Cl.
*B41J 2/14*    (2006.01)
*H01L 23/00*   (2006.01)

(52) U.S. Cl.
CPC ....... *B41J 2/14072* (2013.01); *B41J 2/14201* (2013.01); *H01L 24/03* (2013.01); *H01L 24/05* (2013.01); *H01L 24/48* (2013.01); *B41J 2002/14491* (2013.01); *H01L 2224/03614* (2013.01); *H01L 2224/04042* (2013.01); *H01L 2224/05568* (2013.01); *H01L 2224/48453* (2013.01)

(58) Field of Classification Search
CPC ... B41J 2/14072; B41J 2/14201; H01L 24/03; H01L 24/05; H01L 24/48
See application file for complete search history.

(56) References Cited

U.S. PATENT DOCUMENTS

2017/0021622 A1*    1/2017    Takahashi .................. B41J 2/16

FOREIGN PATENT DOCUMENTS

JP    2017-152588 A    8/2017

* cited by examiner

*Primary Examiner* — Jason S Uhlenhake
(74) *Attorney, Agent, or Firm* — Canon U.S.A., Inc. IP Division

(57) ABSTRACT

A semiconductor element includes an insulation layer and a pad portion for electrical connection to an external portion by wire bonding. The insulation layer includes a plurality of projections projecting from a main surface of the insulation layer. The pad portion is disposed on an upper surface of each of the projections without extending beyond the upper surface of the projection on which the pad portion is formed.

12 Claims, 14 Drawing Sheets

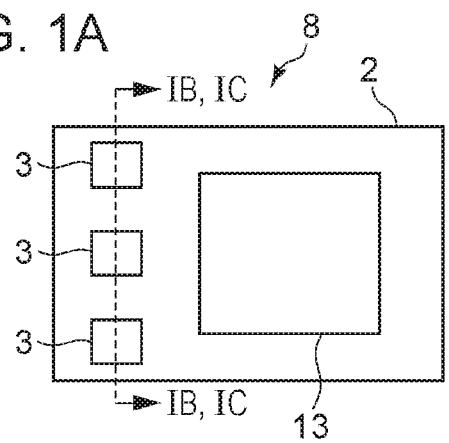
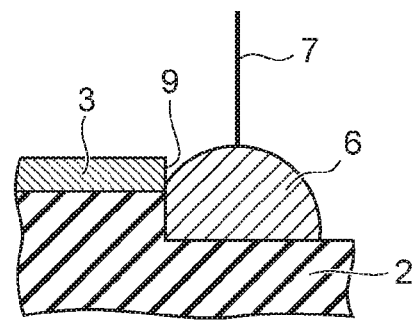
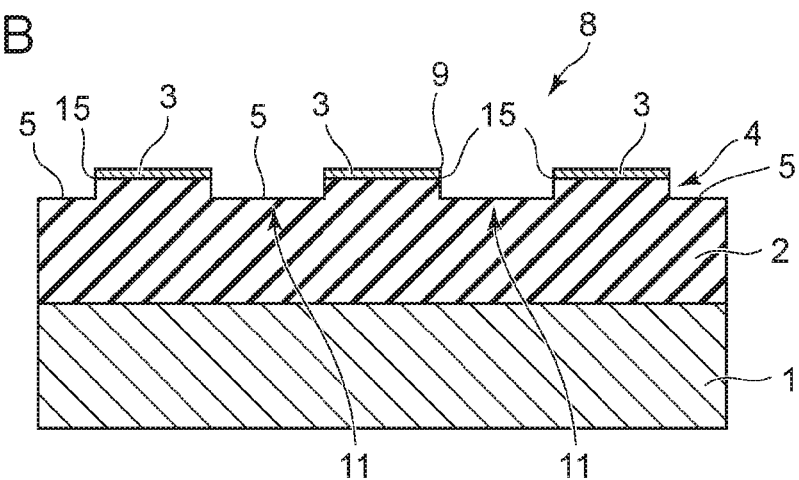
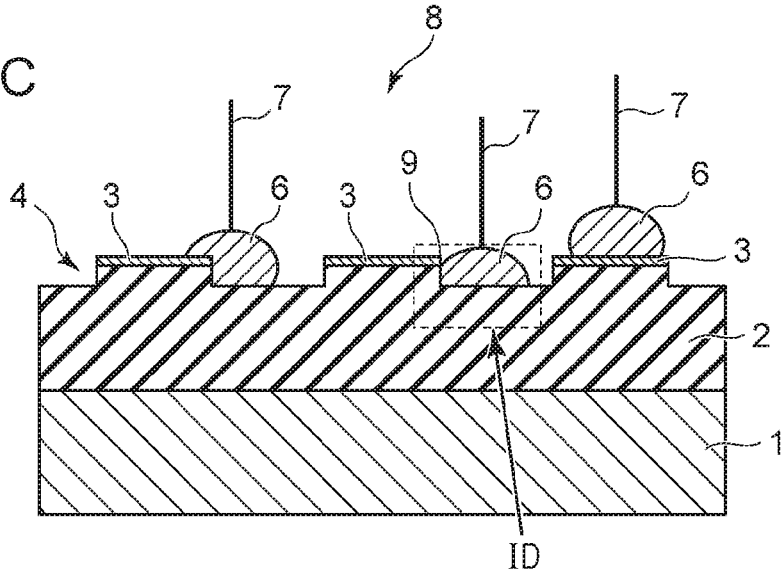

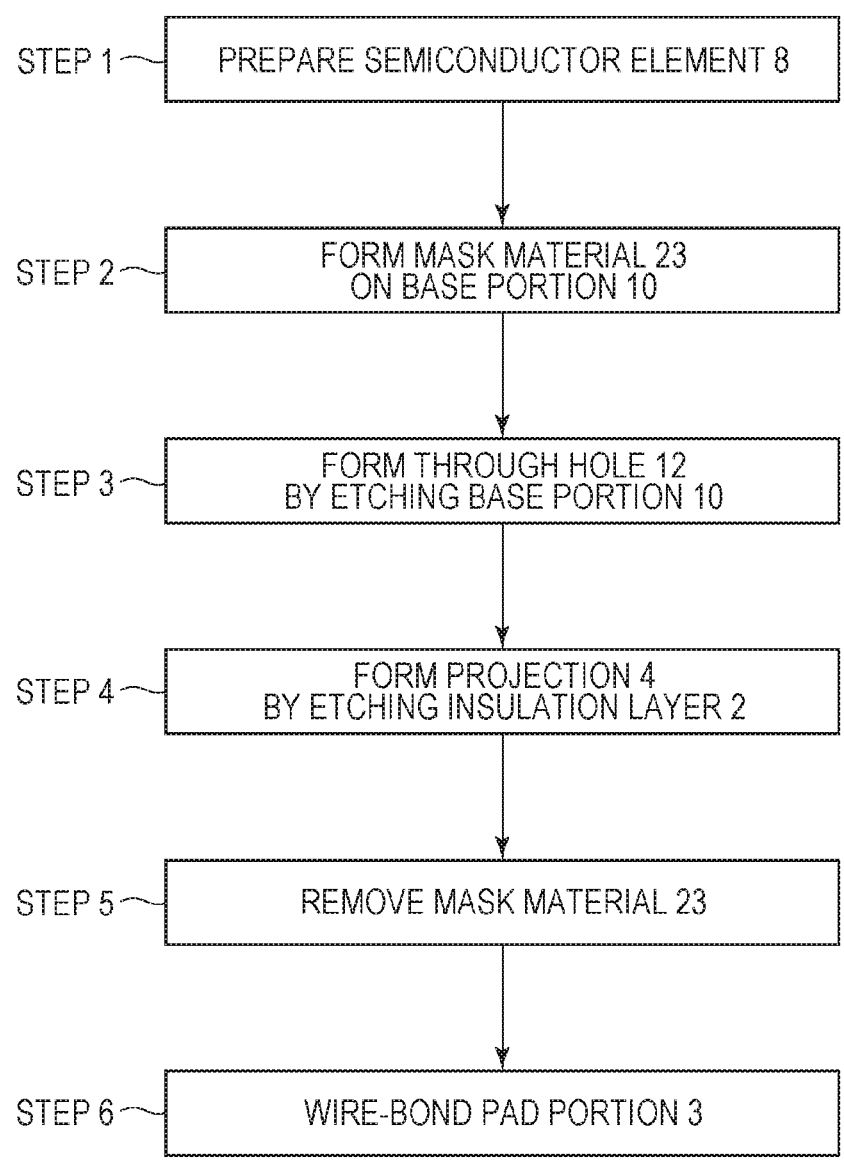

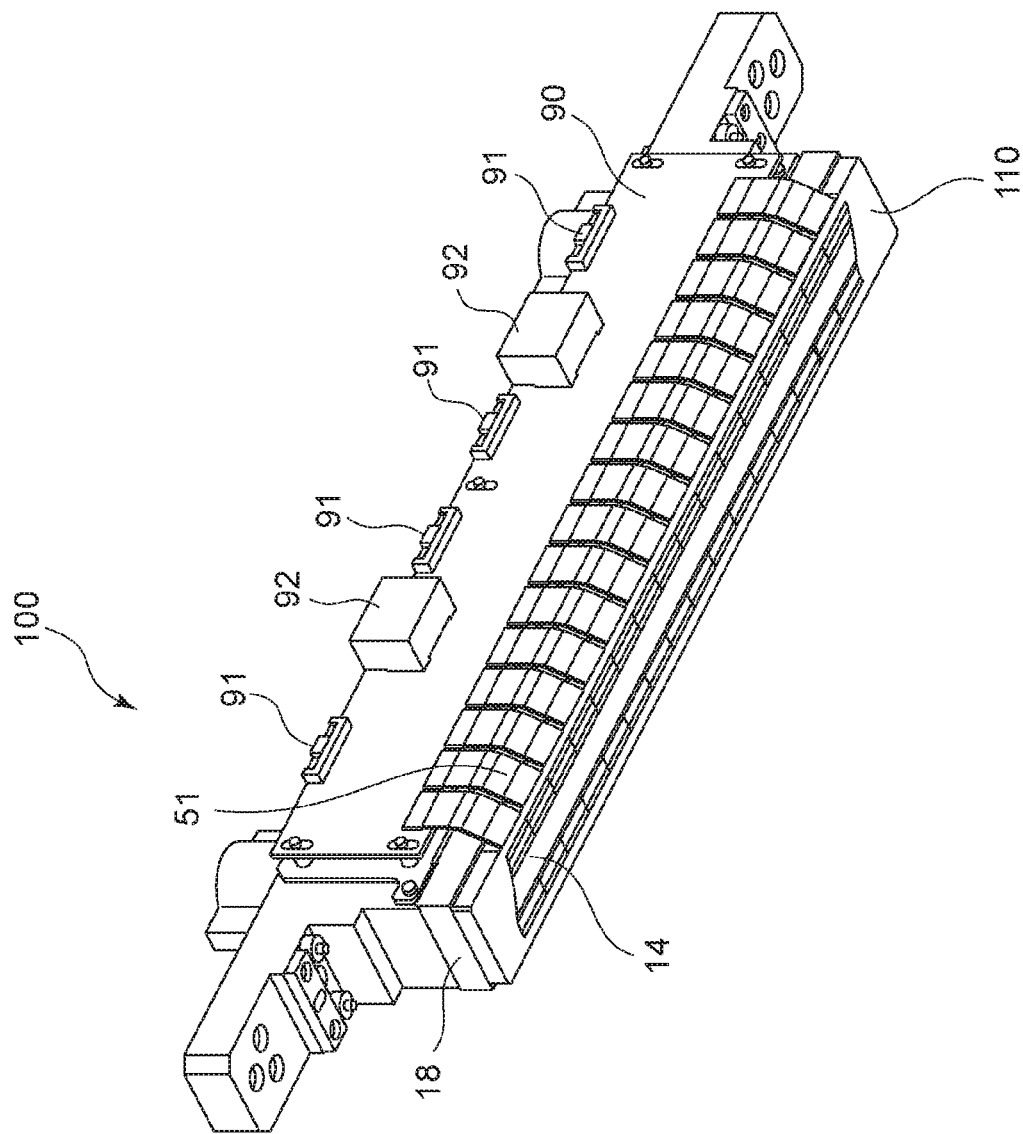

SEMICONDUCTOR ELEMENT, RECORDING ELEMENT SUBSTRATE, AND LIQUID DISCHARGE HEAD

BACKGROUND

Field of the Disclosure

The present disclosure relates to a semiconductor element, a recording element substrate, and a liquid discharge head configured to discharge liquid.

Description of the Related Art

While a pad, which is an electrical connection part to be electrically connected to an external portion, of a semiconductor and an external device are electrically connected to each other by so-called wire bonding, a bonding ball may come into contact with a portion outside the region of the pad as a result of a capillary being displaced from a desired position. Japanese Patent Laid-Open No. 2017-152588 describes a feature of performing electrical connection of a semiconductor device that includes a pad by wire bonding.

SUMMARY

The present disclosure provides a semiconductor element including an insulation layer and a pad portion for electrical connection to an external portion by wire bonding. The insulation layer includes a plurality of projections projecting from a main surface thereof. The pad portion is disposed on an upper surface of each of the projections without extending beyond the upper surface of the projection on which the pad portion is formed.

In addition, the present disclosure provides a recording element substrate including: a discharge-port forming member including a discharge port perforating therethrough for discharging liquid; an insulation layer including an energy generating element configured to generate energy for discharging liquid through the discharge port, and a pad portion electrically connected to the energy generating element and configured to be used for electrical connection to an external portion by wire bonding; and a base portion in contact with the insulation layer. A plurality of projections project from a main surface of the insulation layer. The base portion has a through hole perforating therethrough to expose the insulation layer. The projections are disposed on the main surface exposed by the through hole. The pad portion is disposed on an upper surface of each of the projections and does not extend beyond the upper surface of each of the projections.

Moreover, the present disclosure provides a liquid discharge head including: a recording element substrate including a discharge-port forming member having a discharge port therethrough for discharging liquid, an insulation layer including an energy generating element configured to generate energy for discharging liquid through the discharge port, and a pad portion electrically connected to the energy generating element and configured to be used for electrical connection by wire bonding, and a base portion in close contact with the insulation layer; an electrical connection member having a first end connected to the pad portion and configured to supply power for driving the energy generating element to the energy generating element; and an electrical wiring member connected to a second end of the electrical connection member and including wiring for supplying power to the energy generating element. The insulation layer includes projections projecting from a main surface thereof. The base portion has a through hole extending therethrough to expose the main surface of the insulation layer. The projections are disposed on the main surface exposed by the through hole. The pad portion is disposed on an upper surface of each of the projections and does not extend beyond the upper surface of each of the projections. The liquid discharge head includes a sealing material covering an inner portion of the through hole, a connected portion between the pad portion and the electrical connection member, and a connected portion between the electrical wiring member and the electrical connection member.

Further features of the present invention will become apparent from the following description of exemplary embodiments with reference to the attached drawings.

BRIEF DESCRIPTION OF THE DRAWINGS

FIG. 1A is a top view of a semiconductor element. FIG. 1B is a schematic view of the IB-IB cross section indicated in FIG. 1A. FIG. 1C is a schematic view of the IC-IC cross section indicated in FIG. 1A. FIG. 1D is a schematic view of the region ID illustrated in FIG. 1C.

FIG. 7 is a step flow chart illustrating a method of manufacturing the semiconductor element according to the third embodiment.

FIG. 9 is a schematic view illustrating a whole image of a liquid discharge head.

DESCRIPTION OF THE EMBODIMENTS

Figure 2A:
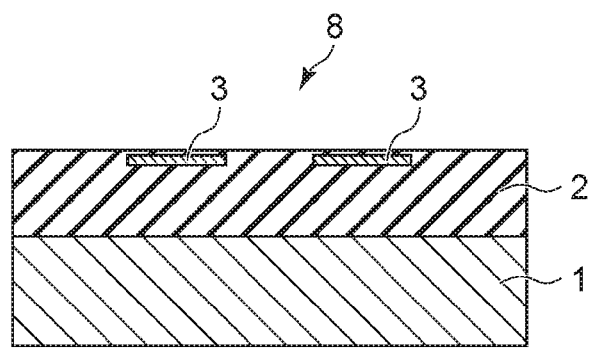
FIG. 2A illustrates a step of preparing a semiconductor element.

When a capillary is displaced from a desired position, if at least a portion of a bonding ball is in contact with a pad, electrical connection is possible. However, when a contact area in which the bonding ball and the pad are in contact with each other is extremely small, even though electrical connection is possible, the state of electrical connection may be unstable due to the small contact area. Moreover, electrical connection may be disconnected due to an impact of an external force and the like after bonding connection.

Considering the aforementioned circumstances, the present disclosure provides a semiconductor element, a recording element substrate, and a liquid discharge head capable of ensuring reliability of electrical connection parts by causing electrical connection not to be performed when a capillary is largely displaced from a desired position.

Hereinafter, a semiconductor element according to an embodiment of the present disclosure and a liquid discharge head that includes the semiconductor element will be described with reference to the drawings. The following description, however, does not intend to limit the scope of the present disclosure. In the present embodiment, a thermal-type liquid discharge head configured to generate air bubbles by using a heating element to discharge liquid is employed as an example; however, the present disclosure is also applicable to a piezoelectric-type liquid discharge head and other liquid discharge heads that employ various liquid discharge types. The liquid discharge head according to the present embodiment will be described by presenting a so-called page-wide type head that has a length corresponding to the width of a recording medium; however, the present disclosure is also applicable to a so-called serial-type liquid discharge head configured to perform recording while scanning a recording medium. An example of the configuration of the serial-type liquid discharge head is a configuration in which, for example, an element substrate for black-ink and an element substrate for color-ink are loaded one each. However, the configuration is a non-limiting example and may be in a form in which a head that is produced so as to be shorter than the width of a recording medium and that includes a plural number of element substrates disposed in the direction of an array of discharge ports so as to overlap the discharge ports is used to scan a recording medium.

First Embodiment

Semiconductor Element

A semiconductor element according to the present embodiment will be described with reference to FIGS. 1A, 1B, 1C, and 1D. FIGS. 1A, 1B, 1C, and 1D are schematic views each illustrating a semiconductor element 8 according to the present embodiment. FIG. 1A is a schematic view illustrating a top surface of the semiconductor element 8. FIG. 1B and FIG. 1C are schematic views respectively illustrating the IB-IB cross section and the IC-IC cross section indicated in FIG. 1A. FIG. 1B is a schematic view illustrating the semiconductor element 8 before so-called wire bonding is performed. FIG. 1C is a schematic view illustrating the semiconductor element 8 after wire bonding is performed. FIG. 1D is an enlarged view of the region ID illustrated in FIG. 1C. As illustrated in FIG. 1A, the semiconductor element 8 is constituted by, mainly, an integrated circuit 13, a pad portion 3 electrically connected via wiring (not illustrated) to the integrated circuit 13 and configured to be used for electrical connection to an external portion, and an insulation layer 2. As illustrated in FIG. 1B, a substrate 1 is disposed at a layer below the insulation layer 2. The substrate 1 is, for example, silicon. The insulation layer 2 is, for example, a silicon oxide film, a silicon nitride film, or a mixture thereof. The pad portion 3 is, for example, a metal. In particular, aluminum, an aluminum-silicon alloy, or an aluminum-copper alloy is suitably used as the metal.

As illustrated in FIG. 1B, the insulation layer 2 that includes a plurality of projections 4 is disposed on the upper surface of the substrate 1. The pad portion 3 that is to be electrically connected to an external device of the semiconductor element 8 is disposed on a top portion (upper surface 15) of each of the projections 4. The projections 4 are provided as projections that locally project from a main surface 5 of the insulation layer 2. The pad portion 3 disposed on the upper surface 15 of each of the projections 4 does not extend beyond the upper surface of the projection on which the pad portion is formed. The pad portion 3 at the right side in FIG. 1C indicates a state of being bonded to a normal position. The pad portion 3 at the left side in FIG. 1C indicates a state of being electrically connected without problems while being displaced from the normal position. The pad portion 3 at the middle in FIG. 1C indicates a state of not being electrically connected due to the bonding position thereof being largely displaced as illustrated in the enlarged view thereof in FIG. 1D.

In the present embodiment, the pad portion 3 is configured to be disposed on the upper surface 15 of each of the projections 4 of the insulation layer 2. The pad portion 3 is configured to not extend from the upper surface 15 of each of the projections 4 to the main surface between the projections. Due to such configurations, when the position of a wire-bonding ball (hereinafter referred to as the ball) 6 is largely displaced from a desired position (on the pad portion 3) as illustrated in FIG. 1D, it is possible to suppress the possibility of a portion (end surface 9) of the pad portion and the ball 6 coming into contact with each other. In other words, it is possible to suppress the possibility of an electrical connection between the portion of the pad portion and the ball 6 occurring in an inadequate state. The possibility of the contact between the end surface 9 and the ball 6 can be further suppressed by increasing the height of the projections 4 to be higher than the height of the ball 6. The height of the projections 4 of the insulation layer 2 in the present embodiment is 5 µm. The height is applicable within the range of 0.5 to 50 pin. The width of the pad portion 3 is smaller than or equal to the width of the projections 4.

According to the present configuration, no metal wiring is disposed in the insulation layer around the projections 4. If metal wiring is present at such a portion, the insulation layer may be broken due to the metal wiring being deformed when the ball is displaced from the pad portion 3. However, according to the present configuration, no wiring layer is present in the insulation layer around the projections 4, and it is thus possible to suppress the insulation layer 2 from being broken even when the ball 6 is displaced from a desired portion.

Method of Manufacturing Semiconductor Element

A method of manufacturing the semiconductor element according to the present embodiment will be described with reference to FIGS. 2A, 2B, 2C, and 2D, and FIG. 3. FIGS. 2A, 2B, 2C, and 2D are schematic views each illustrating the method of manufacturing the semiconductor element according to the present embodiment. FIG. 3 is a step flow chart of the manufacturing method. First, as illustrated in FIG. 2A, the semiconductor element 8 that includes the insulation layer 2 disposed on the substrate 1 so as to include the pad portion 3 therein is prepared (step 1 in FIG. 3). These components can be each formed into a desired pattern on the substrate 1 by employing a commonly used semiconductor process.

Figure 2B:
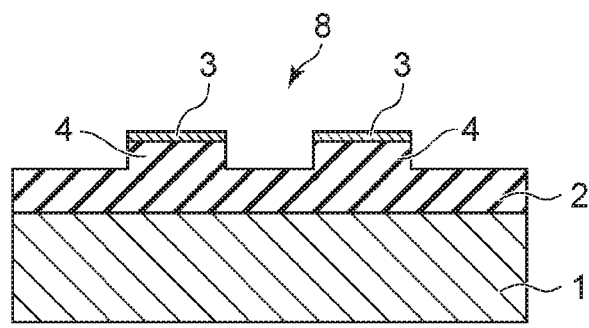
FIG. 2B illustrates a step of forming projections.
Figure 3:
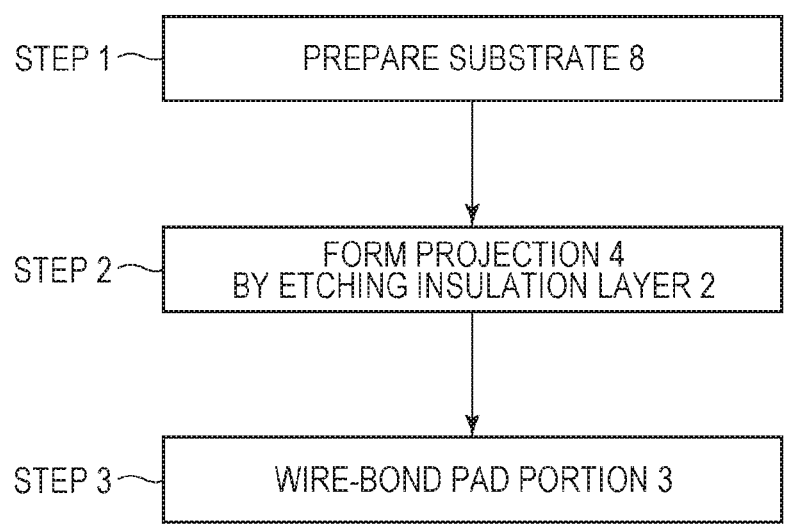
FIG. 3 is a step flow chart illustrating a method of manufacturing a semiconductor element according to a first embodiment.

Next, the projections 4 are formed by etching a portion of the insulation layer 2 (FIG. 2B, step 2 in FIG. 3). The method of etching depends on the material of the insulation layer 2. When the insulation layer 2 is formed of a silicon oxide film, a silicon nitride film, or a mixture thereof, dry etching is suitably employed. In particular, reactive ion etching is suitably employed. Etching can be performed by selecting, as an etching gas, one or a plurality of gases from CF4, CHF3, C4F8, Ar, and the like. The pad portion 3 is formed of a metal. In particular, when a metal that is not etched by these gases is selected, etching stops at a region where the pad portion is present due to the pad portion being exposed. As such a metal, aluminum, an aluminum-silicon alloy, an aluminum-copper alloy, or the like is selectable.

Figure 2C:
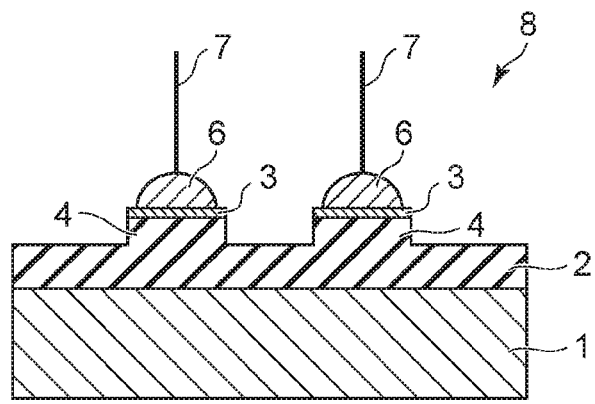
FIG. 2C illustrates a step of performing wire bonding.

Next, as illustrated in FIG. 2C, wire bonding of the pad portion 3 is performed (step 3 in FIG. 3). The material of a wire for wire bonding is selected by considering suitability to the material of the pad portion 3. When the pad portion 3 is formed of aluminum, an aluminum-silicon alloy, or an aluminum-copper alloy, gold is employed.

Figure 2D:
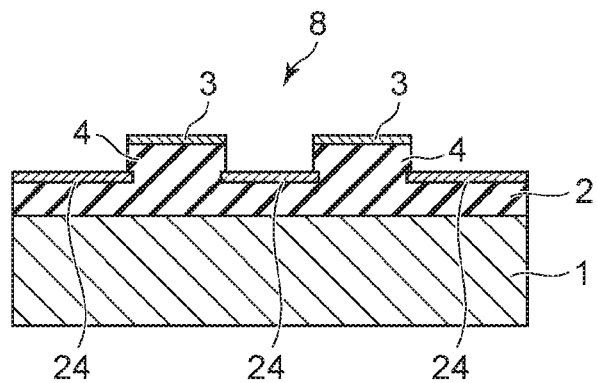
FIG. 2D illustrates a semiconductor element that includes an etching stop layer.

FIG. 2D is a schematic view illustrating the semiconductor element 8 in a case in which the insulation layer 2 that includes an etching stop layer 24 therein is used in the etching of the insulation layer 2 illustrated in the step in FIG. 2B. As illustrated, the etching stop layer 24 is disposed at a region adjacent to the projections 4. If the etching stop layer 24 is not present, etching of the insulation layer 2 is required to be controlled by time, which may cause height variation of the projections 4. If the height of the projections 4 is excessively high, the projections 4 may be broken when wire bonding that uses ultrasonic waves is performed, and thus, conditions of wire bonding are required to be adjusted for each height. In particular, when the insulation layer 2 is etched by reactive ion etching, etching depth varies depending on the depth, the width, and the like of a later-described through hole 12 (FIG. 5), and it is thus difficult to control the height of the projections 4. Due to the insulation layer 2 including the etching stop layer 24 therein, as illustrated in FIG. 2B, progress of etching of the insulation layer 2 stops at the etching stop layer 24. Accordingly, manufacture of the projections 4 that have a constant height is enabled, which eliminates the need to change conditions for each pad portion 3 when performing wire bonding.

The material of the etching stop layer 24 may be any materials provided that the materials are not etched during etching of the insulation layer 2 or slow in terms of reaction to etching. When etching is performed by reactive ion etching that uses a fluorine-based gas, for example, a metal is applicable. Aluminum, an aluminum-silicon alloy, or an aluminum-copper alloy can be used. The thus manufactured semiconductor element includes fewer foreign substances on the surfaces of the pad portions 3 and less generation of corrosion of the pad portions 3 and requires less cost for manufacture thereof.

Second Embodiment

Figure 4:
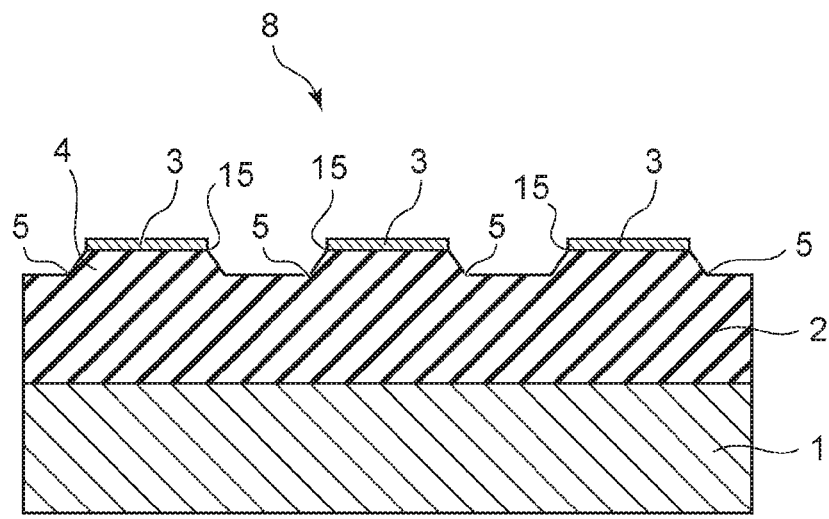
FIG. 4 is a schematic view illustrating a semiconductor element according to a second embodiment.

The semiconductor element 8 according to a second embodiment will be described with reference to FIG. 4. Components identical to those in the first embodiment are given identical signs, and description thereof is omitted. As illustrated in FIG. 4, a characteristic part of the present embodiment is that the projections 4 of the insulation layer 2 are formed such that the width of each of the projections 4 gradually decreases from the side of the main surface 5 toward the side of the upper surface 15. Due to the side surfaces of the projections 4 of the insulation layer 2 having such a tapered shape, the insulation layer 2 is suppressed from being easily broken during wire bonding, and, in particular, the insulation layer 2 can be suppressed from being broken even when a ball is displaced from a desired position.

Third Embodiment

Semiconductor Element

Figure 5:
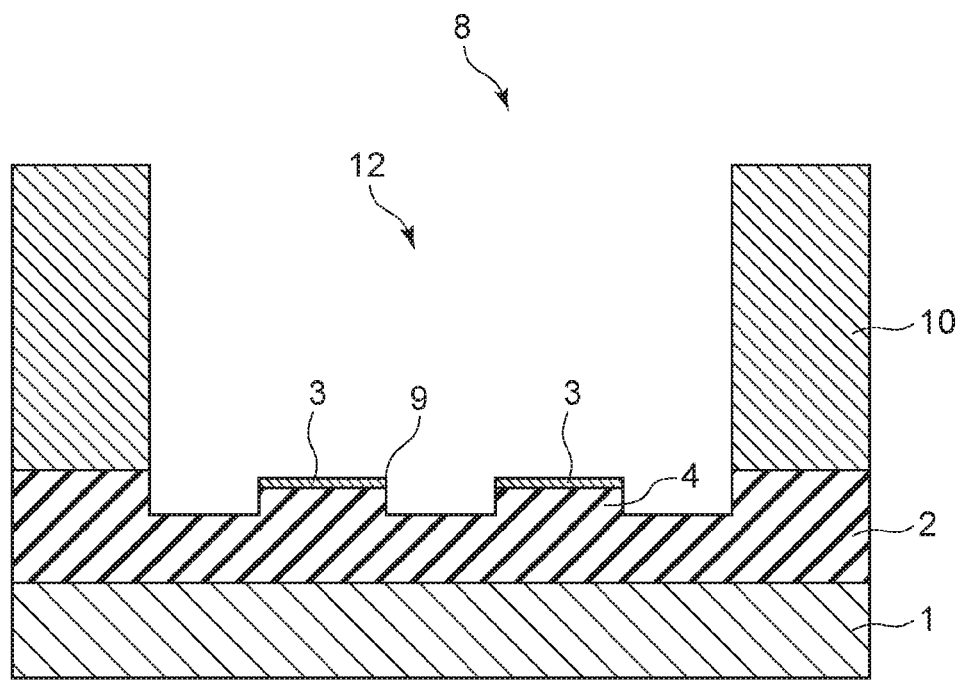
FIG. 5 is a schematic view illustrating a semiconductor element according to a third embodiment.

The semiconductor element 8 according to a third embodiment will be described with reference to FIG. 5. Components identical to those in the first embodiment are given identical signs, and description thereof is omitted. A characteristic part of the present embodiment is that the semiconductor element 8 is disposed at a bottom section of the through hole 12 that is provided in a base portion 10. FIG. 5 is a schematic view illustrating the state. The base portion 10 is constituted by, for example, silicon.

When the pad portion is disposed at the bottom section of the through hole, a bonding tool is required to be inserted into the through hole, and thus, a capillary of the bonding tool is required to be thin and long, resulting in positional accuracy of bonding tending to be degraded depending on the decreased width and the increased length. Even in such a case, due to the projections 4 of the insulation layer 2 being disposed at the bottom section of the through hole 12, and due to the pad portion 3 being disposed on each of the projections 4, it is possible to suppress the pad portion 3 and the ball 6 (not illustrated) from being electrically connected to each other in an inadequate state, and it is thus possible to improve reliability of electrical connection parts.

Method of Manufacturing Semiconductor Element

Figure 6A:
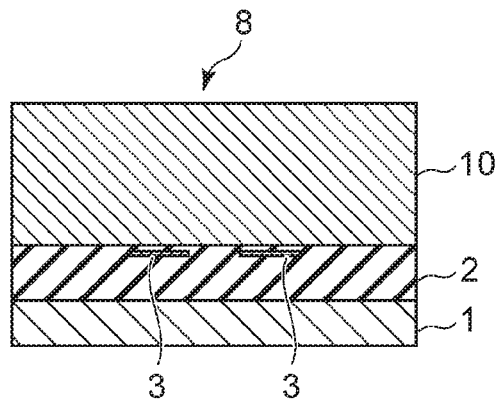
FIG. 6A illustrates a step of preparing a semiconductor element that includes a base portion.

A method of manufacturing the semiconductor element 8 according to the third embodiment will be described with reference to FIGS. 6A, 6B, 6C, 6D, 6E, and 6F, and FIG. 7. Components identical to those in the first embodiment are given identical signs, and description thereof is omitted. First, as illustrated in FIG. 6A, the semiconductor element 8 that includes the base portion 10 is prepared (step 1 in FIG. 7). Next, as illustrated in FIG. 6B, a mask material 23 is formed on the base portion 10 to etch the base portion 10 into a desired pattern (step 2 in FIG. 7). The mask material 23 may be any materials provided that the materials have sufficient protective performance with respect to etching; a resin, a metal, a metal oxide film, or the like is applicable depending on the method of etching. In particular, a photo-resist, which is a resin material, additionally has photosensitivity and thus enables the mask material 23 to be formed easily into a desired pattern.

Figure 6D:
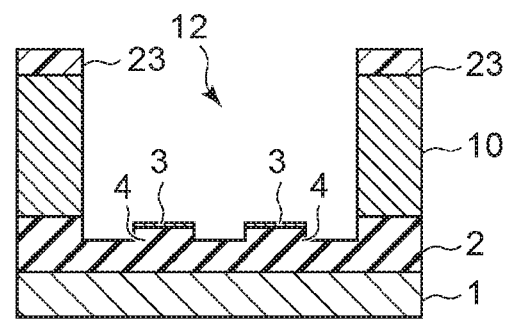
FIG. 6D illustrates a step of forming projections.
Figure 6B:
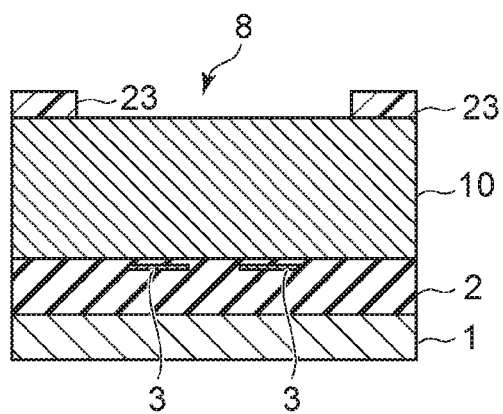
FIG. 6B illustrates a step of forming a mask material on the base portion.
Figure 6E:
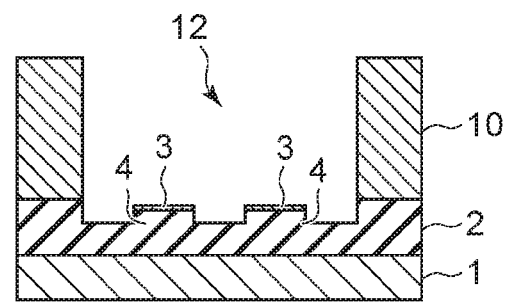
FIG. 6E illustrates a step of removing the mask material.
Figure 6C:
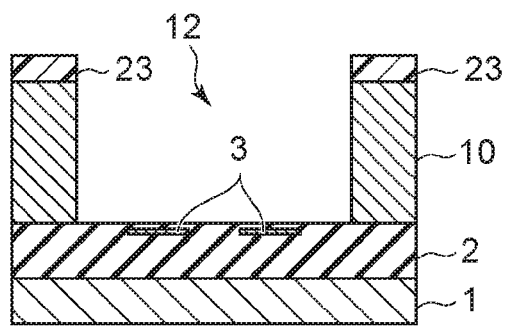
FIG. 6C illustrates a step of forming a through hole.

Next, as illustrated in FIG. 6C, the through hole 12 is formed by etching the base portion 10 (step 3 in FIG. 7). The method of etching depends on the material of the base portion 10; when the base portion 10 is silicon, dry etching or wet etching is applicable. When the mask material 23 is a photoresist, in particular, dry etching is suitably used, and plasma etching that uses a fluorine-based gas transformed into a radical with plasma is applicable. In particular, plasma etching that uses a $SF_6$ gas is suitably used. When the base portion 10 formed of silicon is dry etched vertically as illustrated in FIG. 6C, reactive ion etching is applicable. The through hole 12 that has a deeper depth can be vertically formed by employing a so-called BOSCH process that performs etching by repeating an etching step that uses a $SF_6$ gas and a deposition step that uses a $C_4F_8$ gas.

Next, as illustrated in FIG. 6D, the projections 4 are formed by etching a portion of the insulation layer 2 (step 4 in FIG. 7). The step 4 is identical to the content described in the first embodiment, and description of details is thus omitted.

Next, as illustrated in FIG. 6E, the mask material 23 is removed (step 5 in FIG. 7). Depending on the material of the mask material 23, the mask material 23 can be removed by being immersed in a drug solution that is capable of dissolving the mask material 23 or by being subjected to dry etching. When the mask material 23 is a photoresist, the mask material 23 can be removed by being immersed in an organic solvent or an organic amine-based stripping solution. When the mask material 23 is removed by dry etching, the mask material 23 can be removed by dry etching that uses an $O_2$ gas. Here, in the case of removal by immersion in a drug solution, in general, a removal residue of a mask material and a drug solution tend to remain on a semiconductor element. When these substances adhere to the semiconductor element, a pad portion corrodes, which may cause inadequate bonding strength during subsequently performed wire bonding and may cause electrical connection not to be performed. In contrast, when the pad portion has a projecting shape as in the present embodiment, the removal residue and the drug solution do not easily remain on the semiconductor element, which suppresses the surface of the pad portion that is to be subjected to wire bonding from being unfavorably affected.

Figure 6F:
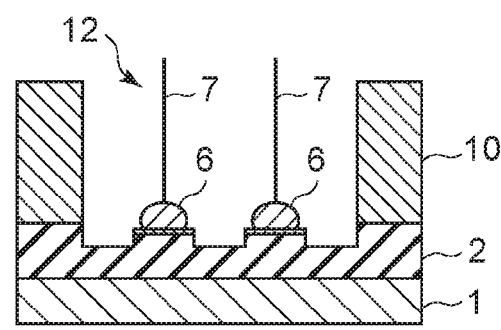
FIG. 6F illustrates a step of performing wire bonding of a pad portion.

Next, as illustrated in FIG. 6F, the semiconductor element 8 is manufactured by performing wire bonding of the pad portion 3 (step 6 in FIG. 7). The step 4 is identical to the content described in the first embodiment, and description of details is thus omitted.

Fourth Embodiment

Figure 8:
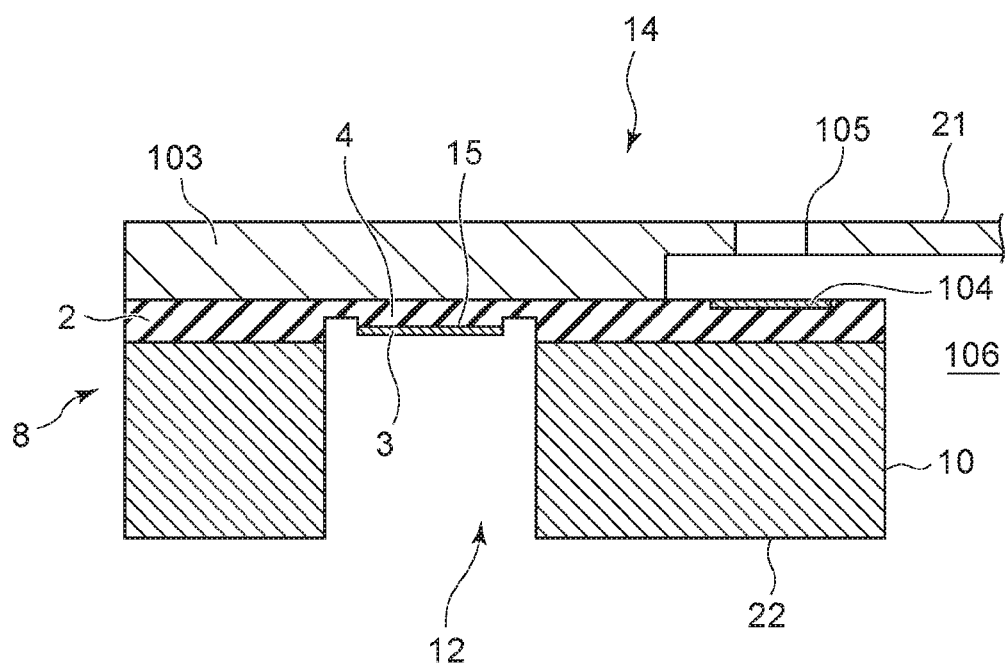
FIG. 8 is a schematic view illustrating a recording element substrate according to a fourth embodiment.

A fourth embodiment will be described with reference to FIG. 8. Components identical to those in the first embodiment are given identical signs, and description thereof is omitted. A characteristic part of the present embodiment is that the semiconductor element 8 is used in a recording element substrate used in a liquid discharge head. FIG. 8 is a schematic view of a recording element substrate 14 that uses the semiconductor element 8. In the present embodiment, the recording element substrate 14 includes the aforementioned semiconductor element. The recording element substrate 14 is constituted by, mainly, a discharge-port forming member 103 that includes a discharge port 105 through which liquid is discharged, and the semiconductor element 8. The semiconductor element 8 includes, in addition to the aforementioned configuration of the pad portion 3 disposed on the upper surface 15 of each of the projections 4, a heater 104 configured to supply energy to liquid. The heater 104 and the pad portions 3 are electrically connected to each other via wiring (not illustrated).

The through hole 12 is formed so as to extend from a rear surface 22 of a surface 21 in which the discharge port 105 is provided toward the pad portion 3. Due to the pad portion 3 being thus disposed at the bottom section of the through hole 12 that is provided so as to extend from the rear surface 22, it is possible to suppress mist-state ink (mist) generated during ink discharging from adhering to electrical connection parts. The recording element substrate 14 can be manufactured by performing manufacturing steps including the steps in FIG. 12C illustrating the method of manufacturing a later-described liquid discharge head 100 and the steps 1 and 2 in FIG. 13.

Fifth Embodiment

A fifth embodiment will be described with reference to FIG. 9 to FIGS. 12A, 12B, 12C, 12D, and 12E. Components identical to those in the first embodiment are given identical signs, and description thereof is omitted. A characteristic part of the present embodiment is that the semiconductor element 8 is used in the liquid discharge head 100.

Liquid Discharge Head

FIG. 9 is a perspective view illustrating the liquid discharge head 100 according to the present embodiment. As illustrated in FIG. 9, the liquid discharge head 100 is a page-wide type liquid discharge head in which 15 units of the recording element substrates 14 each capable of discharging ink of each of four colors of C/M/Y/K are arranged in a linear form (disposed in line). The liquid discharge head 100 includes each of the recording element substrates 14, and signal input terminals 91 and power supply terminals 92 that are electrically connected to each other via electrical wiring members 51 and a plate-shaped electrical wiring substrate 90. The electrical wiring members 51 are, for example, flexible wiring substrates. The signal input terminals 91 and the power supply terminals 92 are electrically connected to a conveying unit (not illustrated) configured to convey recording media (not illustrated) and connected to a control unit of a recording apparatus (not illustrated) including the liquid discharge head 100. The signal input terminals 91 and the power supply terminals 92 are configured to supply discharging drive signals and power required for discharging, respectively, to the recording element substrates 14. The number of the signal input terminals 91 and the power supply terminals 92 can be reduced compared to the number of the recording element substrates 14 by integrating wiring by using an electric circuit in the electrical wiring substrate 90. Consequently, the number of electrical connection parts required to be detached to assemble the liquid discharge head 100 to the recording apparatus or to replace the liquid discharge head 100 is reduced. In FIG. 9, the liquid discharge head is of the page-wide type in which the recording element substrates 14 are disposed in a linear form; however, the present embodiment is not limited thereto, and the liquid discharge head may be of a page-wide type in which the recording element substrates 14 are disposed in a staggered form in the longitudinal direction of the liquid discharge head.

Figure 10A:
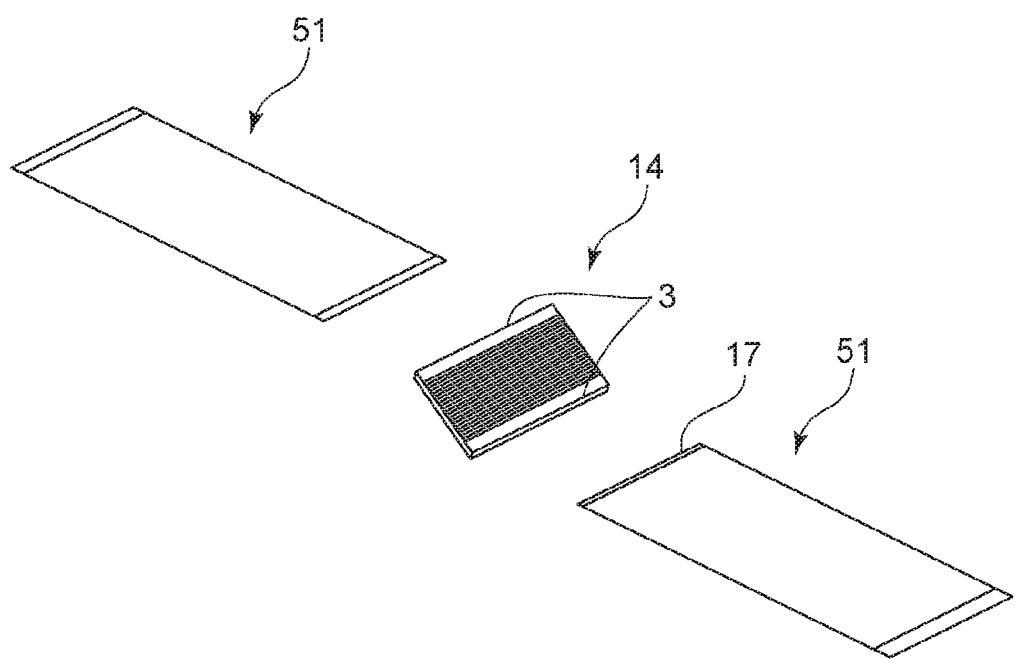
FIG. 10A is a perspective view before the recording element substrate and electrical wiring members are electrically connected to each other.
Figure 10B:
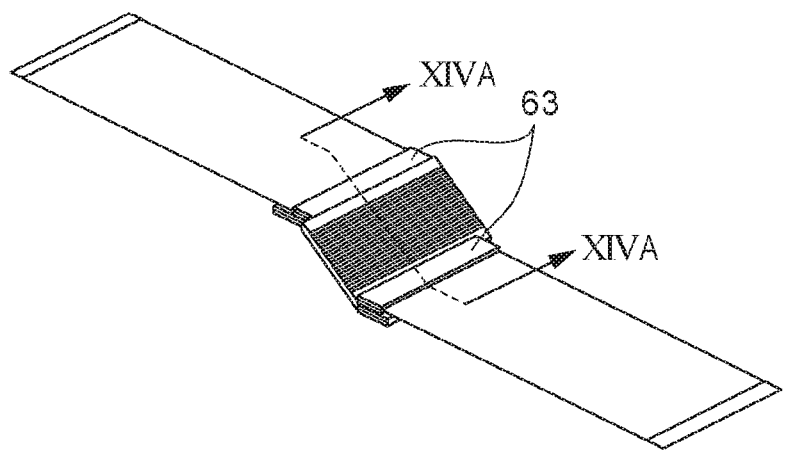
FIG. 10B is a perspective view after the recording element substrate and the electrical wiring members are electrically connected to each other.

FIGS. 10A and 10B are perspective views of one of a plurality of the recording element substrates 14 and the electrical wiring members 51 that are disposed at the liquid discharge head 100. FIGS. 10A and 10B each illustrate the rear surface side of the surface of the recording element substrate 14 in which the discharge port is provided. FIG.

10A is a perspective view before the recording element substrate 14 and the electrical wiring members 51 are electrically connected to each other. FIG. 10B is a perspective view after the recording element substrate 14 and the electrical wiring members 51 are electrically connected to each other. In FIGS. 10A and 10B, a liquid-channel member 120 (FIG. 11A) is omitted for ease of description. As illustrated in FIG. 10A, the recording element substrate 14 includes the pad portions 3, and the electrical wiring members 51 each include a terminal 17. The pad portions 3 and the terminals 17 are electrically connected to each other via a wire 7 by wire bonding. A joined portion therebetween is covered with a sealing material 63 (FIG. 10B).

Figure 11A:
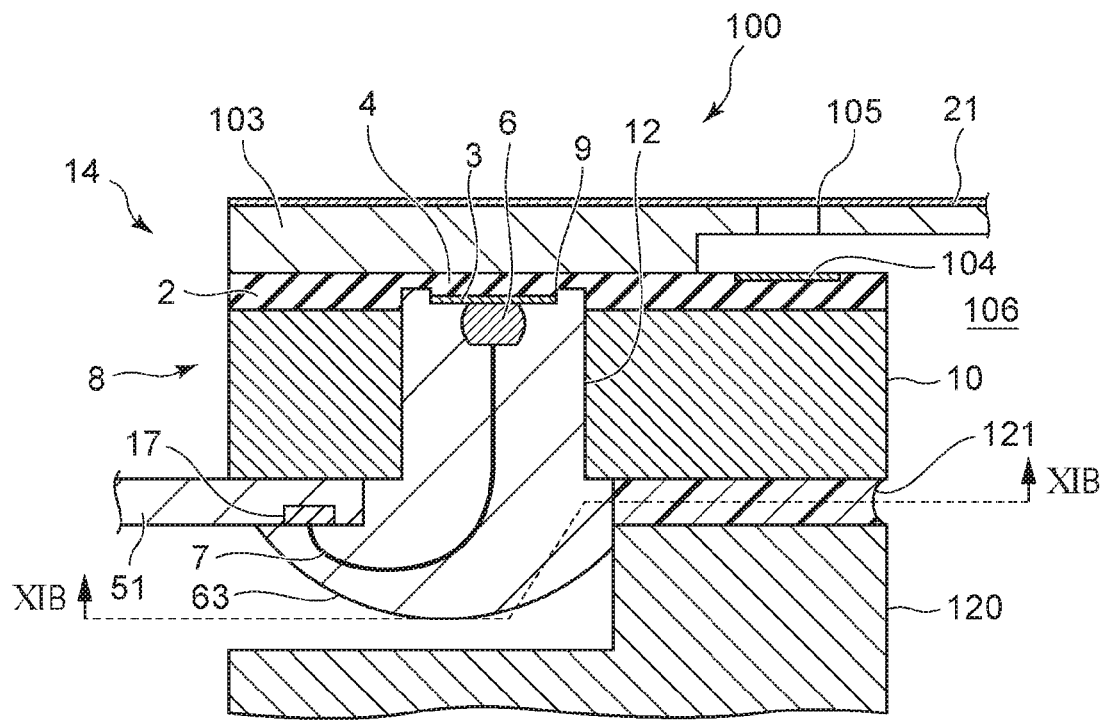
FIG. 11A is a schematic view of the liquid discharge head, illustrating a portion of the XIVA-XIVA cross section indicated in FIG. 10B.
Figure 11B:
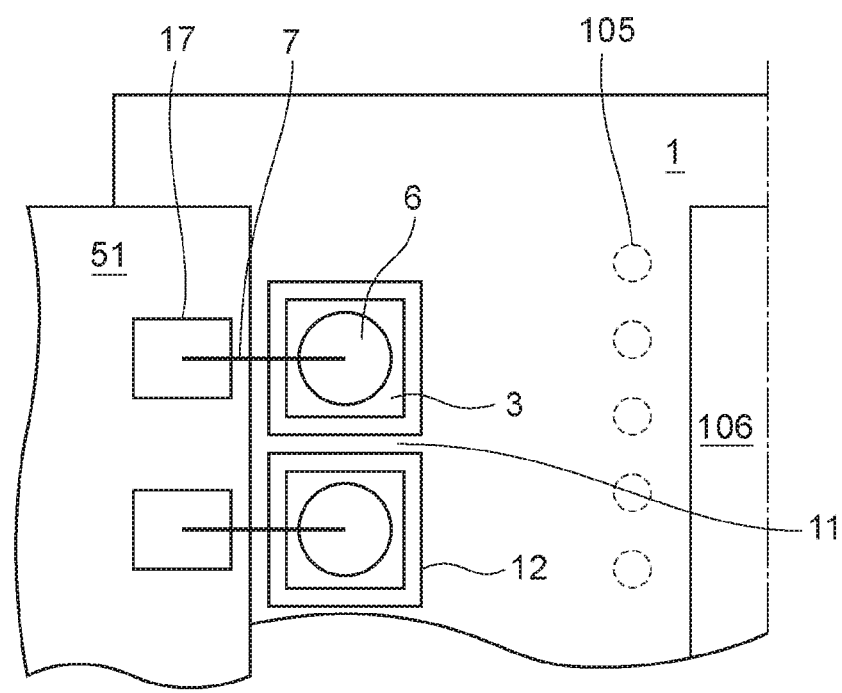
FIG. 11B is a plan view of the liquid discharge head viewed in the XIB-XIB cross section indicated in FIG. 11A.

FIG. 11A is a schematic view of the liquid discharge head 100, illustrating a portion of the XIVA-XIVA cross section in FIG. 10B. FIG. 11B is a schematic plan view of the liquid discharge head 100 viewed in the XIB-XIB cross section in FIG. 11A and illustrates a state in which the sealing material 63 is omitted for ease of description. As illustrated in FIG. 11A, the liquid discharge head 100 is constituted by, mainly, the recording element substrates 14 and the liquid-channel member 120. The recording element substrates 14 are each constituted by, mainly, the discharge-port forming member 103 that includes the discharge port 105 through which liquid is discharged, a wiring layer (not illustrated), the insulation layer 2, and the base portion 10 formed of silicon. The wiring layer is configured to electrically connect the heater 104, which is an energy generating element that supplies energy to liquid in the vicinity of the discharge port 105, and the pad portions 3 to each other. The heater 104 and the pad portions 3 may be electrically connected to each other with a transistor (not illustrated) or various circuits disposed therebetween. The liquid-channel member 120 is a member that constitutes a channel for supplying liquid that is to be discharged through the discharge port 105 to the recording element substrates 14. An ink supply port 106 is a portion that serves as a channel for ink that is to be supplied into the discharge port 105. The electrical wiring members 51 are disposed on the recording element substrates on the rear surface side. Upon being supplied with power from the electrical wiring members 51, the heater 104 generates air bubbles in ink by heating the ink and discharges the ink through the discharge port 105 by using the pressure of bubble generation thereof.

The through hole 12 is provided in the rear surface of each of the recording element substrates 14. The insulation layer 2 of the projections 4 is disposed at the bottom section of the through hole 12, and, on the upper surface (top surface) of each of the projections 4, a plurality of the pad portions 3 are disposed. The pad portions 3 disposed on the upper surface of each of the projections do not extend to the main surface 11 of the insulation layer between the projections adjacent to each other. The pad portions 3 and a first end portion of the wire 7 are electrically connected to each other. A second end portion of the wire 7 is electrically connected to the terminals 17 of the electrical wiring members 51. The sealing material 63 is disposed inside the through hole 12 so as to cover the pad portions 3, the terminals 17, and the wire 7. The liquid-channel member 120 and the base portion 10 are in close contact with each other via an adhesive 121. The adhesive 121 has a function of sealing a gap between the liquid-channel member 120 and the base portion 10 to suppress ink at the ink supply port 106 from flowing into the gap, in addition to a function of bonding the liquid-channel member 120 and the base portion 10 to each other. The sealing material 63 and the adhesive 121 are formed of, for example, an epoxy resin and may be, however, formed of materials different from each other.

Due to the pad portions 3 being disposed at the bottom section of the through hole 12 that is provided so as to extend from the rear surface of the base portion 10, it is possible to suppress mist generated during ink discharging from adhering to electrical connection parts. When the pad portions are disposed at the bottom section of the through hole, a capillary of a bonding tool is required to be thin and long, resulting in positional accuracy of bonding tending to be degraded depending on the decreased width and the increased length. Even in such a case, due to the projections 4 of the insulation layer 2 being disposed at the bottom section of the through hole 12, and due to the pad portions 3 being disposed on the upper surface of each of the projections 4, it is possible to suppress the pad portions 3 and the ball 6 from being electrically connected to each other in an inadequate state, and it is thus possible to improve reliability of electrical connection parts.

Method of Manufacturing Liquid Discharge Head

Figure 12A:
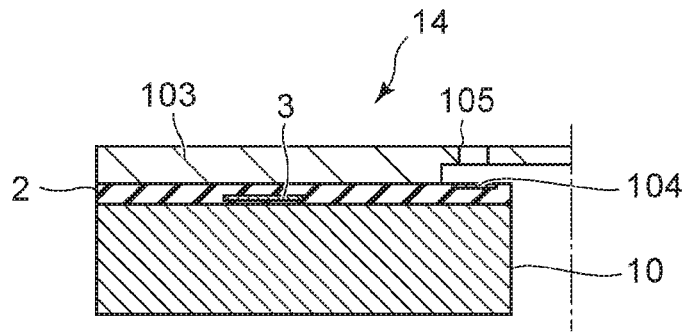
FIG. 12A illustrates a step of preparing a recording element substrate.
Figure 12B:
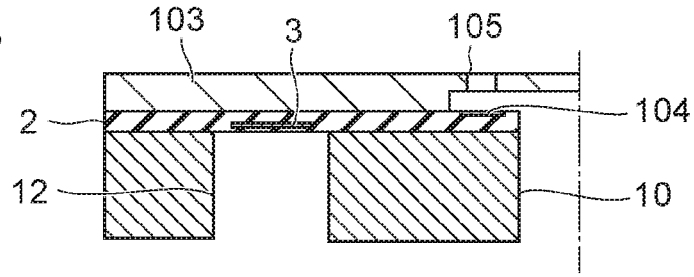
FIG. 12B illustrates a step of forming a through hole.
Figure 12C:
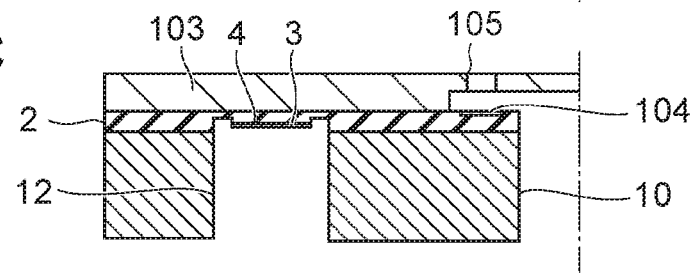
FIG. 12C illustrates a step of forming a projection.
Figure 12D:
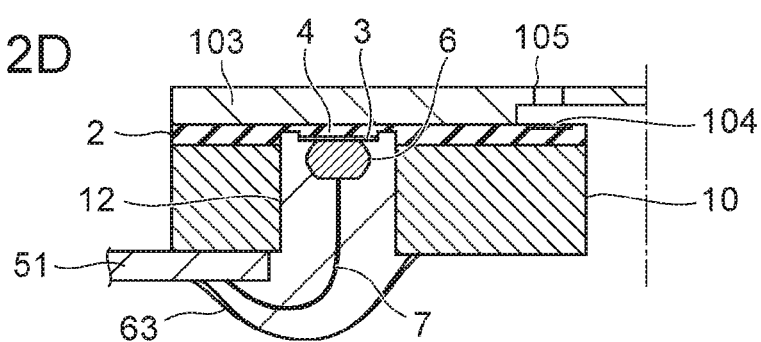
FIG. 12D illustrates a step of attaching an electrical wiring member to a base portion and injecting a sealing material into the through hole.
Figure 12E:
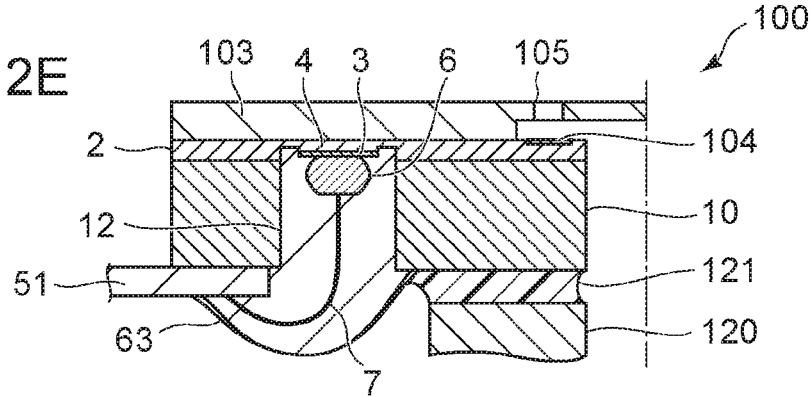
FIG. 12E illustrates a step of attaching a liquid-channel member to the recording element substrate.
Figure 13:
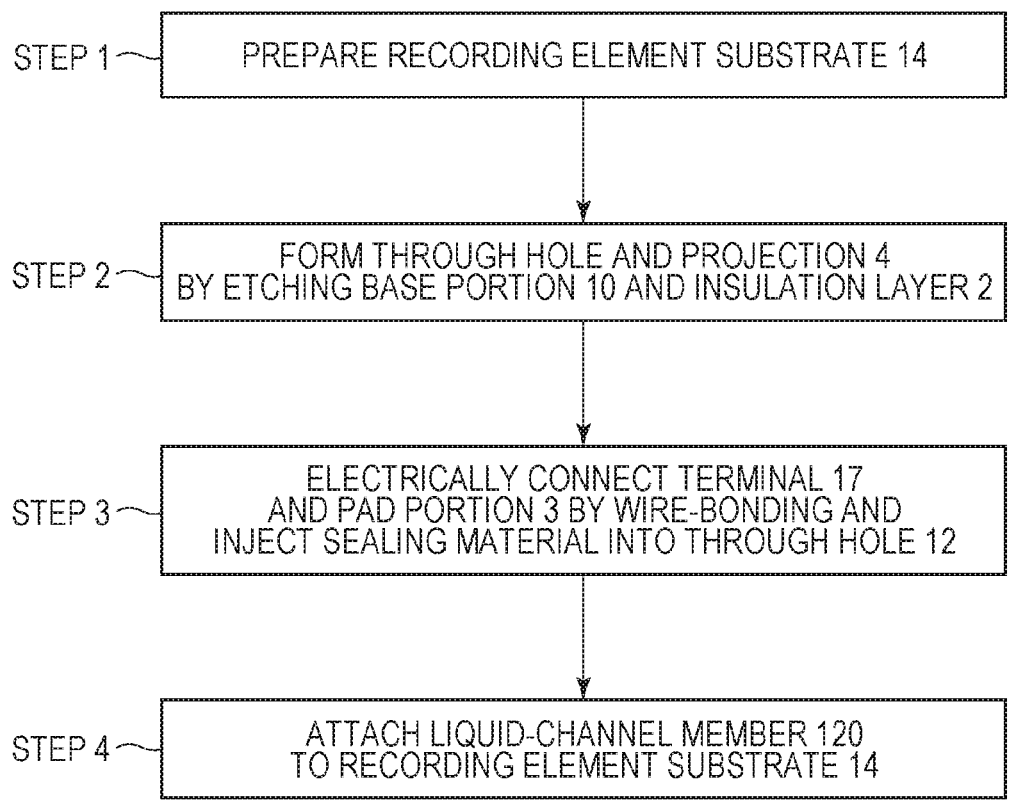
FIG. 13 is a step flow chart illustrating a method of manufacturing a liquid discharge head.

FIGS. 12A, 12B, 12C, 12D, and 12E are schematic views illustrating a method of manufacturing the liquid discharge head 100 according to the present embodiment. FIG. 13 is a step flow chart of the manufacturing method. First, as illustrated in FIG. 12A, the recording element substrate 14 that includes the discharge port 105 and other elements is prepared (step 1 in FIG. 13). Next, as described in the section of the third embodiment with reference to FIGS. 6A, 6B, 6C, 6D, 6E, and 6F, and FIG. 7, the through hole 12 and the projections 4 are formed by etching the base portion 10 and the insulation layer 2 (step 2 in FIG. 13). Next, as illustrated in FIG. 12D, the electrical wiring member 51 is attached to the base portion 10. Next, the terminals 17 (FIGS. 11A and 11B) of the electrical wiring member 51 and the pad portions 3 are electrically connected to each other by wire bonding that uses the wire 7 that is formed of Au, and a portion around the electrical connection part and the Au wire 7 is sealed by injecting the sealing material 63 into the through hole 12 (step 3 in FIG. 13). Next, the liquid-channel member 120 is attached to the recording element substrate 14 by using the adhesive 121, thereby manufacturing the liquid discharge head 100.

The liquid discharge head 100 is manufactured by performing etching and the like after preparing the recording element substrate 14 that includes the discharge-port forming member 103; however, the present embodiment is not limited thereto. In other words, the discharge-port forming member 103 may be formed on the insulation layer 2 by so-called photolithography or the like after the through hole 12 and the projections 4 are formed by etching the base portion 10 and the insulation layer 2. The same applies to the method of manufacturing the recording element substrate 14 presented in the section of the fourth embodiment.

Sixth Embodiment

The liquid discharge head 100 according to a sixth embodiment will be described with reference to FIGS. 14A and 14B. Components identical to those in the first embodiment are given identical signs, and description thereof is omitted. A characteristic part of the present embodiment is that a fixing member 110 is attached so as to be in contact with a surface of the liquid discharge head 100 in which the discharge port 105 is provided.

Figure 14A:
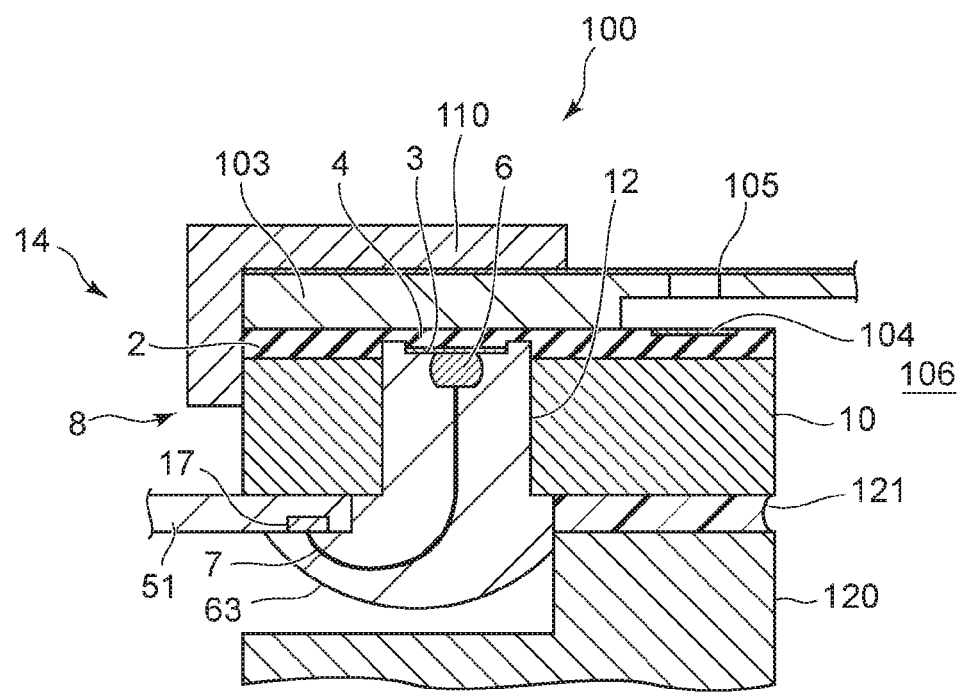
FIG. 14A is a schematic view illustrating a portion of the recording element substrate viewed in the XIVA-XIVA cross section indicated in FIG. 10B.
Figure 14B:
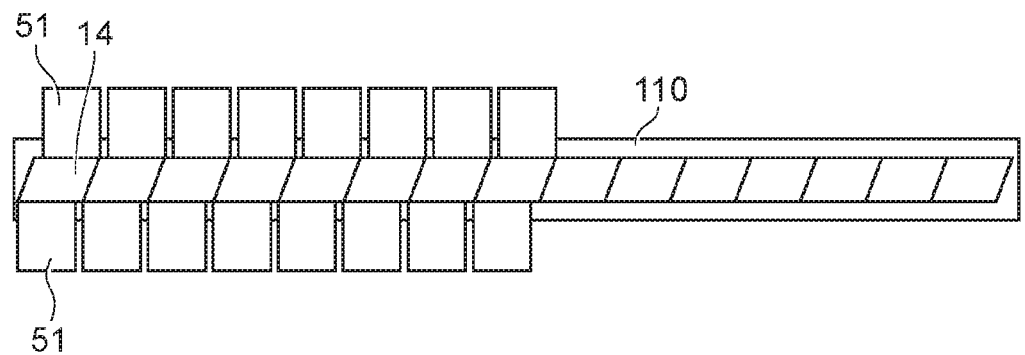
FIG. 14B is a schematic view of a plurality of the recording element substrates and a fixing member viewed from the rear surface side of the recording element substrates.

FIG. 14A is a schematic view illustrating a portion of the recording element substrate 14 viewed in the XIVA-XIVA cross section indicated in FIG. 10B. FIG. 14B is a schematic view of the fixing member 110 and a plurality of the recording element substrates 14 attached to the fixing member 110, viewed from the rear surface side of the recording element substrates 14. As illustrated in FIG. 14B, the fixing member 110 has a frame form that includes an opening portion for exposing the recording element substrates 14. The inner surface side of the frame body and the recording element substrates 14 are fixed to each other by using an adhesive (not illustrated).

The through hole 12 is provided in a portion of the rear surface of each of the recording element substrates 14, and thus, the strength of the portion may be decreased. In the present embodiment, the fixing member 110 is disposed so as to correspond to the location where the through holes 12 are provided. In other words, in a view in the direction in FIG. 14B, the through holes 12 and a frame portion of the fixing member 110 are located so as to overlap each other. Accordingly, the present embodiment can improve the strength of the portion of each of the recording element substrates 14 in which respective through hole 12 is provided. As the material of the fixing member 110, various types of materials, such as resin and metal, are applicable, and, from the point of view of strength, metal, such as SUS, can be used. Resin is also applicable, and, from the point of view of strength, a resin that contains a filler can be used.

The joined portion between a recording apparatus body (not illustrated) and the liquid discharge head 100 is disposed at a support member 18 (FIG. 9) that supports the fixing member 110. The fixing member 110 is attached to the support member 18. The recording element substrates 14 are attached to the fixing member 110. Accordingly, a positioning reference of the recording element substrates 14 is the fixing member 110. However, due to the joined portion joined to the liquid discharge head 100 being disposed at the support member 18 in the vicinity of the fixing member 110, dimensional tolerance generated by various components of the liquid discharge head 100 applies less influence to positional accuracy of the recording element substrates 14. Therefore, the configuration of the present embodiment can also improve the dimensional accuracy of the recording element substrates 14 with respect to the recording apparatus. Moreover, the joined portion between the recording apparatus and the liquid discharge head 100 can be disposed at the fixing member 110 from the point of view of dimensional accuracy since the distance between the joined portion and the recording element substrates 14 is decreased.

COMPARATIVE EXAMPLE

Figure 15A:
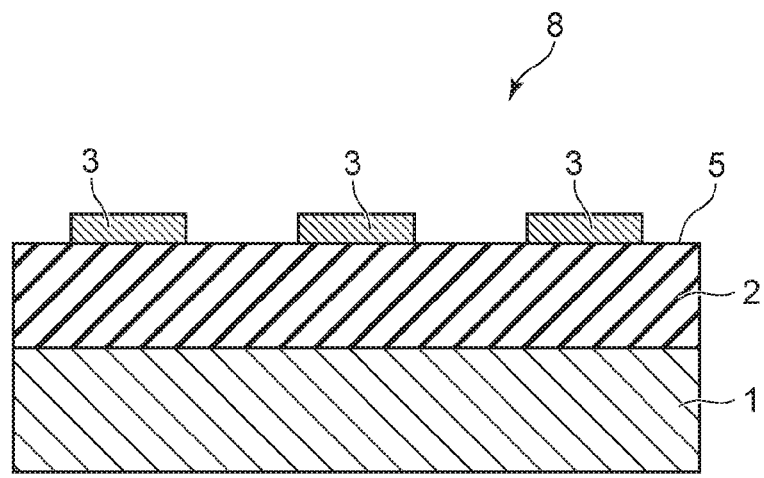
FIG. 15A is a schematic view of a comparative example, corresponding to FIG. 1B.
Figure 15B:
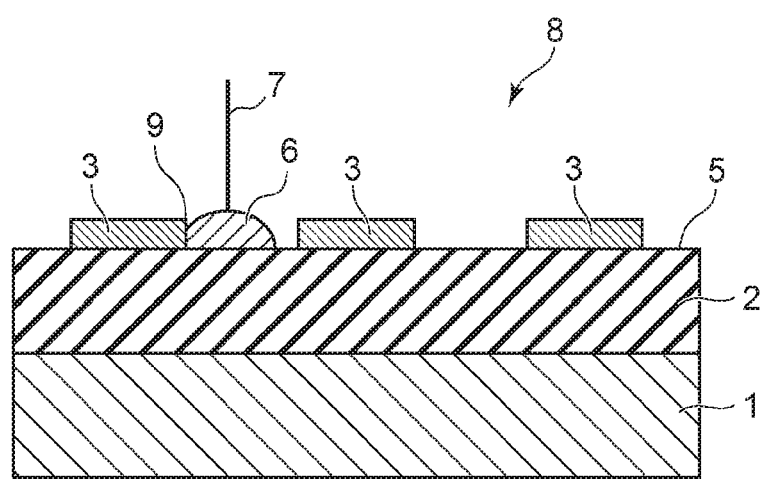
FIG. 15B is a schematic view of the comparative example, corresponding to FIG. 1C.

A comparative example will be described with reference to FIGS. 15A and 15B. FIGS. 15A and 15B are schematic views each illustrating a comparative example corresponding to the semiconductor element according to the first embodiment. Portions identical to those in the first embodiment are given identical signs, and description thereof is omitted. FIG. 15A is a schematic view of the comparative example corresponding to FIG. 1B. FIG. 15B is a schematic view of the comparative example corresponding to FIG. 1C. In the comparative example, the semiconductor element 8 includes no projections that project from the main surface 5 of the insulation layer. The pad portions 3 are thus disposed on the main surface 5 of the insulation layer 2. Accordingly, when the ball 6 is largely displaced from a desired position (on the pad portion 3), the end surface 9 of the pad portion 3 and the ball 6 come into contact with each other and are electrically connected to each other. However, reliability of electrical connection is not so high because the area of contact between the pad portion 3 and the ball 6, which are in contact with each other at only a region of the end surface 9 of the pad portion 3, is small.

Thus, in the aforementioned embodiments, as described above, the pad portion 3 is disposed on the upper surface of each of the projections 4 of the insulation layer. The pad portion 3 does not extend beyond the upper surface of the projection on which the pad portion is formed. Such a configuration suppresses the ball 6 from coming into contact with the end surface 9 of the pad portion 3 when the ball 6 is displaced from a desired position. Consequently, it is possible to suppress electrical connection from being performed in an inadequate state (a state in which the area of contact between the ball 6 and the pad portion 3 is small).

According to the present disclosure, electrical connection is not performed when a capillary is largely displaced from a desired position, and it is thus possible to suppress electrical connection from being performed in an unstable state, which enables reliability of electrical connection parts to be improved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-125042 filed Jun. 29, 2018 and Japanese Patent Application No. 2019-096199 filed May 22, 2019, which are hereby incorporated by reference herein in their entirety.

What is claimed is:
1. A semiconductor element comprising:
a substrate;
an insulation layer disposed on the substrate; and
a pad portion for electrical connection to an external portion by wire bonding,
wherein the insulation layer includes a plurality of projections projecting from a main surface thereof, the main surface is at an opposite side of a surface facing the substrate; and
wherein the pad portion is disposed on an upper surface of each of the projections without extending beyond the upper surface of the projection on which the pad portion is formed.

2. The semiconductor element according to claim 1, further comprising a base portion on and in contact with the insulation layer, the base having a through hole exposing the main surface of the insulation layer, wherein the projections are disposed on the main surface exposed by the through hole.

3. The semiconductor element according to claim 1, wherein each of the projections has a width that decreases in a direction from the main surface toward the upper surface.

4. The semiconductor element according to claim 1, wherein a height of each of the projections is greater than a height of a wire-bonding ball.

5. The semiconductor element according to claim 1, further comprising an etching stop layer at a region adjacent to the projections of the main surface of the insulation layer.

6. The semiconductor element according to claim 1, wherein the insulation layer is an oxide film or a nitride film.

7. A recording element substrate comprising:
a discharge-port forming member including a discharge port perforating therethrough for discharging liquid;
an insulation layer, including an energy generating element configured to generate energy for discharging liquid through the discharge port, and a pad portion electrically connected to the energy generating element and configured to be used for electrical connection to an external portion by wire bonding; and a base portion in contact with the insulation layer, wherein a plurality of projections project from a main surface of the insulation layer, wherein the base portion has a through hole perforating therethrough to expose the insulation layer, wherein the projections are disposed on the main surface exposed by the through hole, and wherein the pad portion is disposed on an upper surface of each of the projections and does not extend beyond the upper surface of each of the projections.

8. A liquid discharge head comprising:

a recording element substrate including:
  a discharge-port forming member having a discharge port therethrough for discharging liquid,
  an insulation layer including:
    an energy generating element configured to generate energy for discharging liquid through the discharge port, and
    a pad portion electrically connected to the energy generating element and configured to be used for electrical connection by wire bonding, and
  a base portion in close contact with the insulation layer;
an electrical connection member having a first end connected to the pad portion and configured to supply power for driving the energy generating element to the energy generating element; and
an electrical wiring member connected to a second end of the electrical connection member and including wiring for supplying power to the energy generating element, wherein the insulation layer includes projections projecting from a main surface thereof, wherein the base portion has a through hole extending therethrough to expose the main surface of the insulation layer, wherein the projections are disposed at on the main surface exposed by the through hole, wherein the pad portion is disposed on an upper surface of each of the projections and does not extend beyond the upper surface of each of the projections, and wherein the liquid discharge head includes a sealing material covering an inner portion of the through hole, a connected portion between the pad portion and the electrical connection member, and a connected portion between the electrical wiring member and the electrical connection member.

9. The liquid discharge head according to claim 8, further comprising a fixing member in contact with a surface of the discharge-port forming member in which the discharge port is provided.

10. The liquid discharge head according to claim 8, wherein the liquid discharge head is a page-wide type liquid discharge head in which a plurality of the recording element substrates are arranged.

11. The liquid discharge head according to claim 10, wherein the plurality of recording element substrates are disposed in a staggered form in a longitudinal direction of the liquid discharge head.

12. The liquid discharge head according to claim 10, wherein the plurality of recording element substrates are disposed in a linear form in a longitudinal direction of the liquid discharge head.

* * * * *